United States Patent
Yang et al.

(10) Patent No.: US 8,415,652 B2
(45) Date of Patent: Apr. 9, 2013

(54) MEMRISTORS WITH A SWITCHING LAYER COMPRISING A COMPOSITE OF MULTIPLE PHASES

(75) Inventors: Jianhua Yang, Palo Alto, CA (US); Gilberto Ribeiro, Menlo Park, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 220 days.

(21) Appl. No.: 12/819,763

(22) Filed: Jun. 21, 2010

(65) Prior Publication Data

US 2011/0309321 A1    Dec. 22, 2011

(51) Int. Cl.
*H01L 29/02* (2006.01)
(52) U.S. Cl. ............. 257/4; 257/3; 257/2; 257/E29.002; 438/102; 438/103; 438/104
(58) Field of Classification Search .................. 257/2–5, 257/E29.002; 438/102–104
See application file for complete search history.

(56) References Cited

U.S. PATENT DOCUMENTS

| | | | |
|---|---|---|---|
| 7,153,721 B2 | 12/2006 | Campbell | |
| 7,639,523 B2 | 12/2009 | Celinska et al. | |
| 2010/0002491 A1 | 1/2010 | Hwang et al. | |
| 2011/0253966 A1* | 10/2011 | Nickel et al. | 257/4 |

FOREIGN PATENT DOCUMENTS

WO    2009114796 A1    9/2009

OTHER PUBLICATIONS

J. Yang et al., "The Mechanism of Electroforming of Metal Oxide Memristive Switches", Research Paper, Information and Quantum Systems Lab, Hewlett-Packard Laboratories; Department of Physics and Astronomy, University of California, Published 2009.
T. Driscoll et al., "5. Phase-Transition Driven Memristive System", Research Paper, University of California, San Diego. physics department; MIT—Device Team, ETRI. Daejeon 305-350, Republic of Korea.

* cited by examiner

*Primary Examiner* — Jami M Valentine
(74) *Attorney, Agent, or Firm* — David W. Collins (57) ABSTRACT

A memristor with a switching layer that includes a composite of multiple phases is disclosed. The memristor comprises: a first electrode; a second electrode spaced from the first electrode; and a switching layer positioned between the first electrode and the second electrode, the switching layer comprising the multi-phase composite system that comprises a first majority phase comprising a relatively insulating matrix of a switching material and a second minority phase comprising a relatively conducting material for forming at least one conducting channel in the switching layer during a fabrication process of the memristor. A method of making the memristor and a crossbar employing the memristor are also disclosed.

17 Claims, 8 Drawing Sheets

MEMRISTORS WITH A SWITCHING LAYER COMPRISING A COMPOSITE OF MULTIPLE PHASES

STATEMENT OF GOVERNMENT INTEREST

This invention was made in the course of research partially supported by grants from the U.S. Government. The U.S. Government has certain rights in the invention.

BACKGROUND

The continuous trend in the development of electronic devices has been to minimize the sizes of the devices. While the current generation of commercial microelectronics are based on sub-micron design rules, significant research and development efforts are directed towards exploring devices on the nano-scale, with the dimensions of the devices often measured in nanometers or tens of nanometers. Besides the significant reduction of individual device size and much higher packing density compared to microscale devices, nanoscale devices may also provide new functionalities due to physical phenomena on the nanoscale that are not observed on the microscale.

For instance, electronic switching in nanoscale devices using titanium oxide as the switching material has recently been reported. The resistive switching behavior of such a device has been linked to the memristor circuit element theory originally predicted in 1971 by L. O. Chua. The discovery of the memristive behavior in the nanoscale switch has generated significant interest, and there are substantial on-going research efforts to further develop such nanoscale switches and to implement them in various applications. One of the many important potential applications is to use such a switching device as a memory unit to store digital data.

Memristor switch devices, which are often formed of nanoscale metal/titanium oxide/metal layers, employ an "electroforming" process to enable resistive switching. The electroforming process involves a one-time application of a relatively high voltage or current that produces a significant change of electronic conductivity through the titanium oxide layer. The electrical switching arises from the coupled motion of electrons and ions within the oxide material. During the electroforming process, oxygen vacancies are created and drift towards the cathode, forming localized conducting channels in the oxide. Simultaneously, $O^{2-}$ ions drift towards the anode where they evolve $O_2$ gas, causing physical deformation of the junction. The gas eruption often results in physical deformation of the oxide, such as bubbles, near the locations where the conducting channels form. In addition, the conducting channels formed through the electroforming process often have a wide variance of properties depending upon how the electroforming process occurred. This variance of properties has relatively limited the adoption of metal oxide switches in computing devices.

In addition, in order to be competitive with CMOS FLASH memories, the emerging resistive switches need to have a switching endurance that exceeds at least millions of switching cycles. Reliable switching channels inside the device may significantly improve the endurance of the switches.

BRIEF DESCRIPTION OF THE DRAWINGS

Embodiments are illustrated by way of example and not limited in the following figure(s), in which like numerals indicate like elements, wherein:

FIGS. 2A-2C are binary phase diagrams of three transition metal oxide systems, useful in the practice of embodiments of the invention, wherein FIG. 2A depicts the Ta—O system, FIG. 2B depicts the Hf—O system, and FIG. 2C depicts the Y—O system.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent, however, to one of ordinary skill in the art that the embodiments may be practiced without limitation to these specific details. In other instances, well known methods and structures are not described in detail so as not to unnecessarily obscure the description of the embodiments.

Disclosed herein is an electrically actuated device, which is equivalently recited herein as a memristor, formed of a pair of spaced apart electrodes with a switching material positioned between the electrodes. It should thus be understood that the terms "electrically actuated device" and "memristor" are used interchangeably throughout the present disclosure. In any regard, the switching layer employed herein is a composite comprising a continuous matrix of a switching, non-conducting material and discontinuous regions of a conducting material embedded therein. The discontinuous regions form conducting channels within the non-conducting matrix during a fabrication process of the memristor, as discussed in greater detail herein below. At least one conducting channel may electrically connect the two electrodes.

In one regard, therefore, the at least one conducting channel is formed in the switching layer without requiring that an electroforming process be performed on the memristor, and as such, the memristor comprises an electroforming-free memristor. The memristor disclosed herein thus does not suffer from some of the drawbacks associated with conventional devices that require an electroforming process to generate conducting channels. In addition, the memristor disclosed herein requires a relatively low power to operate because the relatively high voltage or current required to generate the conducting channel required with conventional devices is not necessary. Moreover, because the conducting channel of the memristor disclosed herein is formed during the fabrication process, the conducting channel may be formed with a relatively greater level of control as compared with conventional devices that employ electroforming operations to form conducting channels. The memristors thus exhibit a greater endurance, usually exceeding one million switching cycles.

The memristor discussed herein may be implemented in a cross-bar array formed of a plurality of the memristors. In one respect, conducting channels in the plurality of memristors may be formed concurrently with each other through the fabrication process discussed herein. As such, the conducting channels may be formed in a relatively simpler and faster manner than is possible with conventional fabrication techniques, which require the application of a relatively high voltage or current through each of the devices to form the conducting channels. Physical damage that often occurs to devices fabricated with conventional techniques is eliminated in these devices. In addition, because the conducting channels are produced under the exact same conditions for all of the devices in the cross-bar array through implementation of the fabrication process disclosed herein, there is a lower level of variance in the formation of the conducting channels as compared with conventional fabrication techniques. Because of the intrinsic property of the material systems selected in the current technique, the conductance channels are also smaller. As such, the distributions of ON-OFF resistances through the conducting channels and the operation parameters are significantly smaller than cross-bar arrays formed through conventional fabrication techniques.

The term "singly configurable" means that a switch is able to change its state only once via an irreversible process such as an oxidation or reduction reaction; such a switch may be the basis of a programmable read only memory (PROM), for example.

The term "reconfigurable" means that a switch can change its state multiple times via a reversible process such as an oxidation or reduction; in other words, the switch may be opened and closed multiple times such as the memory bits in a random access memory (RAM).

The term "configurable" means either "singly configurable" or "reconfigurable".

Micron-scale dimensions refer to dimensions that range from 1 micrometer to a few micrometers in size.

Sub-micron scale dimensions refer to dimensions that range from 0.1 nanometers to 500 nanometers (0.5 micrometers).

Micron-scale and submicron-scale wires refer to rod or ribbon-shaped conductors or semiconductors with widths or diameters having the dimensions of 0.04 to 10 micrometers, heights that can range from a few nanometers to a micrometer, and lengths of several micrometers and longer.

In some embodiments, a memristor is a two-terminal device in which the magnetic flux (time interval of applied voltage) between the terminals is a function of the amount of electric charge that has passed through the device. However, three- and four-terminal memristors are also known, and the teachings disclosed and claimed herein apply to such devices as well.

A crossbar is an array of memristors that can connect each wire in one set of parallel wires to every member of a second set of parallel wires that intersects the first set (usually the two sets of wires are perpendicular to each other, but this is not a necessary condition).

As used herein, the functional dimension of the device is measured in nanometers (typically less than 50 nm), but the lateral dimensions may be nanometers, sub-microns or microns. By "functional dimension" refers to that area between crossing wires of a crossbar that is active. In general, the functional dimension is approximately the cross-sectional area of the memristor between the two crossing wires or a smaller region inside the cross-sectional area.

As used herein, the phrase "metallic-like" refers to a phase having a relatively higher electrical conductivity than a matrix in which the phase is embedded. In many embodiments, the difference in electrical conductivity between the metallic-like phase and the matrix can be on the order of $10^3$ or more at a certain temperature.

Figure 1:
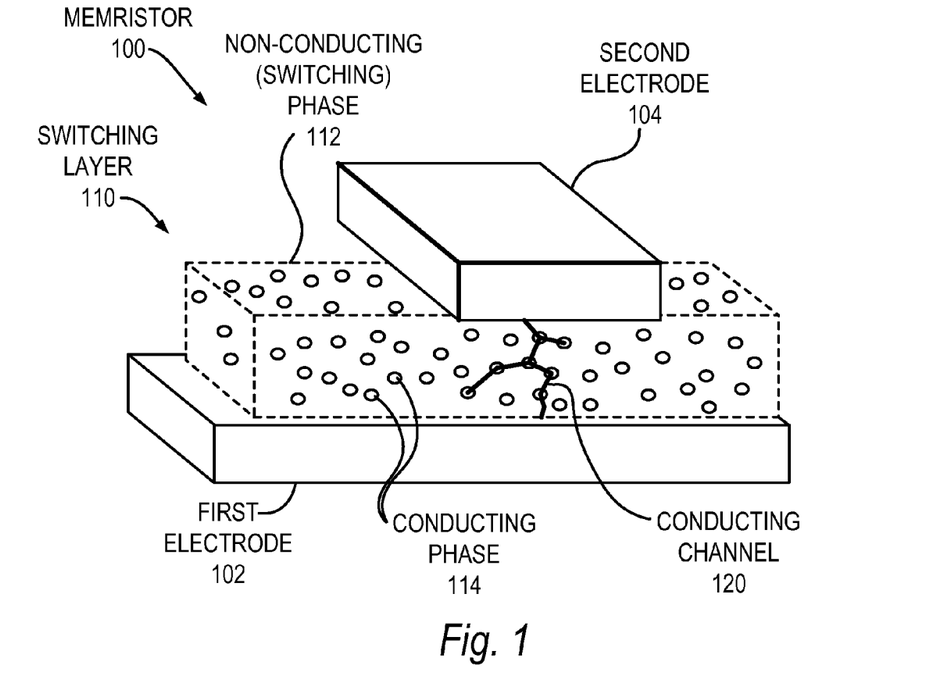
FIG. 1 illustrates a perspective view of a memristor, according to an embodiment of the invention.

With reference first to FIG. 1, there is shown a perspective view of a memristor 100 according to an embodiment. It should be understood that the memristor 100 depicted in FIG. 1 may include additional components and that some of the components described herein may be removed and/or modified without departing from a scope of the memristor 100. It should also be understood that the components depicted in FIG. 1 are not drawn to scale and thus, the components may have different relative sizes with respect to each other than as shown therein.

Generally speaking, the memristor 100 depicted in FIG. 1 may be built at the micro- or nano-scale and used as a component in a wide variety of electronic circuits. For instance, the memristor 100 may be used as the basis for memories, switches, and logic circuits and functions. When used as a basis for memories, the memristor 100 may be used to store a bit of information, 1 or 0. When used as a switch, the memristor 100 may either be a closed or open switch in a cross-point memory. When used as a logic circuit, the memristor 100 may be employed as bits in a logic circuit that resembles a Field Programmable Gate Array, or as the basis for a wired-logic Programmable Logic Array. The memristor 100 disclosed herein is also configured to find uses in a wide variety of other applications, such as neuromorphic computing and implication logic.

As depicted in FIG. 1, the memristor 100 includes a first electrode 102 positioned below a second electrode 104. In addition, the first electrode 102 is in a crossed arrangement with respect to the second electrode 104, such that the first electrode 102 is arranged substantially perpendicularly to the second electrode 104. However, it will be appreciated that in other embodiments, the first electrode 102 and the second electrode 104 may be arranged at any non-zero angle with respect to each other.

One or both of the first electrode 102 and the second electrode 104 may be formed of metal or semiconductor materials. By way of particular example, both of the first electrode 102 and the second electrode 104 may be formed of, for instance, platinum, tungsten, gold, titanium, silver, ruthenium dioxide, thanium nitride, tungsten nitride, tantalum, tantalum nitride or the like. As another particular example, both the first electrode 102 and the second electrode 104 may be formed of doped silicon.

The memristor 100 also includes a switching layer 110 disposed between the first electrode 102 and the second electrode 104. The switching layer 110 has been shown with dashed lines to indicate that the switching layer may be relatively larger than the first electrode 102 and the second electrode 104. In other embodiments, the switching layer 110 may be relatively smaller than the first electrode 102 and the second electrode 104. In any event, the switching layer 110 is depicted as being formed of a matrix of a resistive, or non-conducting, first phase 112 that is capable of switching and a conducting, or metallic-like, second phase 114 embedded or dispersed in the resistive first phase. The switching material comprising the non-conducting first phase 112 may include, for instance, a transition metal oxide, such as tantalum oxide, yttrium oxide, hafnium oxide, zirconium oxide, etc. or a metal oxide, such as aluminum oxide, calcium oxide, magnesium oxide, etc.

The material of the switching layer 110 may alternatively be formed of ternary or quaternary oxides, or other complex oxides, such as, STO, PCMO, etc. In other embodiments, the material of the switching layer 110 may be formed of nitrides and/or sulfides.

The conducting second phase 114 may comprise the same metal that comprises the transition metal oxide or metal oxide of the non-conducting first phase layer 112. For example, in the tantalum oxide system, the first phase layer 112 may comprise $\beta$-$Ta_2O_5$, which is essentially non-conducting, and the conducting phase 114 may comprise $TaO_x$, where x is greater than or equal to 0 and less than or equal to 1 ($0 \leqq x \leqq 1$) (see FIG. 2A). As another example, the non-conducting layer 112 may comprise $TiO_2$, also known as stoichiometric titanium dioxide, and the conducting phase 114 may comprise a Magnelli phase such as $Ti_4O_7$.

The insulating first phase 112 may comprise more than 50% by weight of the total system, in order to prevent a totally conducting situation, which would no longer act as a memristor. In some embodiments, the insulating first phase 112 may comprise more than 90% by weight of the total system. In any event, the conducting second phase 114 comprises the balance of the system.

An annealing operation or other thermal forming operation, such as heating by exposure to a high temperature environment or by exposure to electrical resistance heating, may be employed to form conducting channels 120. For many systems, such as Ta—O, Hf—O, Y—O, and the like, electrical resistance heating that generates an elevated temperature is sufficient to form the conducting channels 120 locally inside the cross-sectional area. The temperature in the localized region inside the device can be several hundred degrees Celsius up to the eutectic temperatures of the material system, which is significantly lower than those found in the bulk material phase diagrams due to nanoscale effects.

Figure 2A:
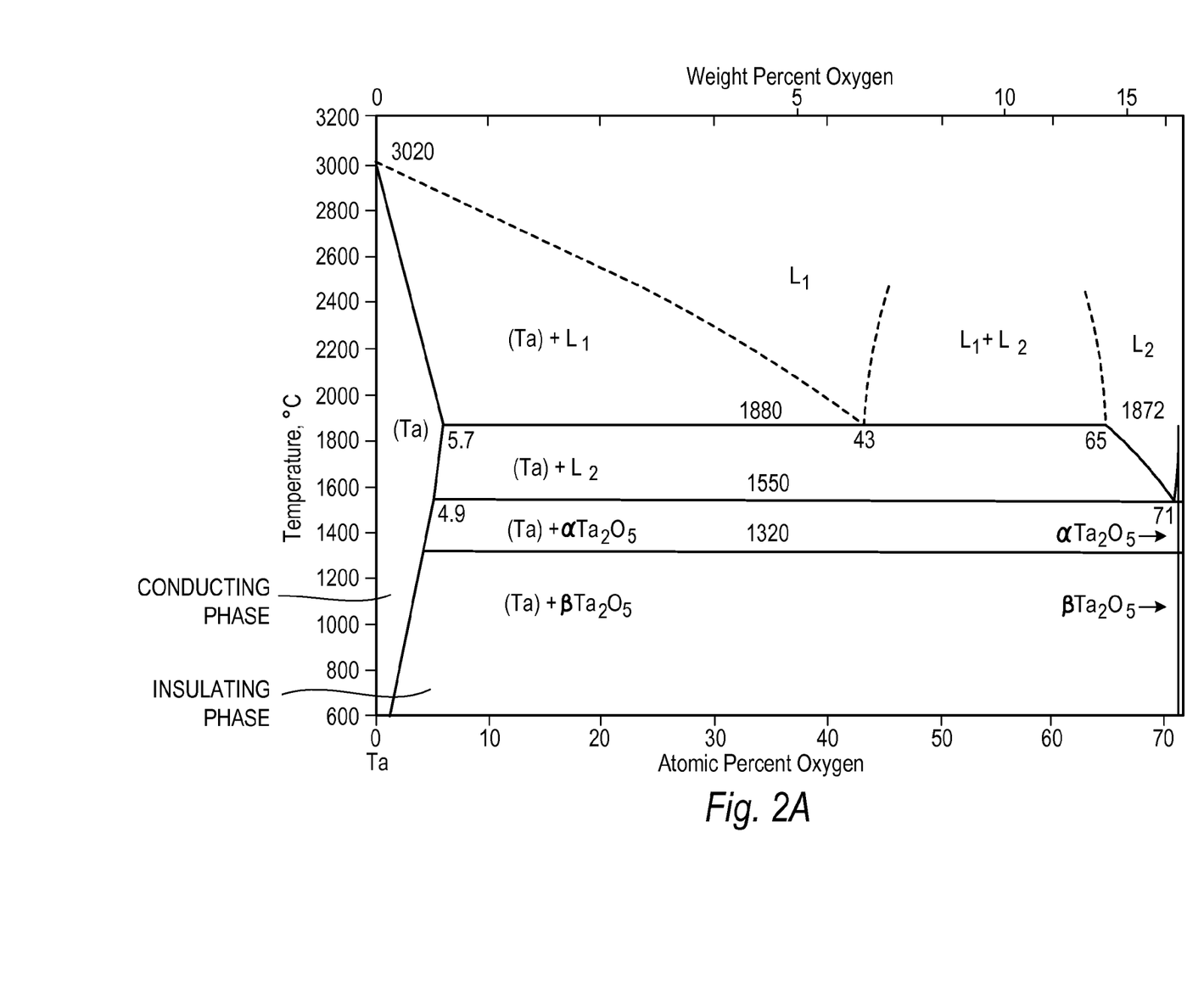

The phase diagram for the Ta—O system is shown in FIG. 2A. Inspection of the phase diagram shows a stable oxide phase, $\beta$-$Ta_2O_5$, at about 71.4 at % (atomic percent) oxygen. This non-conducting phase is in equilibrium with Ta for oxygen concentrations less than 71.4 at %, forming a $TaO_x$ phase. The Ta phase is a conducting phase. So, in the Ta—O system, $\beta$-$Ta_2O_5$ comprises the non-conducting first phase and Ta—O solid solution ($TaO_x$) comprises the conducting second phase.

The phase diagram for the Ta—O system indicates that the transition temperature between the $\alpha$-$Ta_2O_5$ phase and the $\beta$-$Ta_2O_5$ phase is about 1320° C. However, it should be noted that this temperature is for the bulk system; at nanoscale size, the temperature needed for forming the conducting channels 120 is considerably lower, depending on the size and geometry of the channels. Moreover, localized portions of the device may operate at several hundred degrees due to the current applied during electrical resistance heating. As a consequence, a large voltage is not needed to initiate operation, as may be required for prior art devices. Rather, the "forming" voltage is similar to the normal operating voltage. For example, if the normal operating voltage is 1 V, there may be a variance of ±0.2 V; the first operating voltage on the as-prepared devices is within this range. In this case, the device can be viewed as electroforming-free, since the "electroforming" step is indistinguishable from normal operation. In an embodiment, a metastable insulating phase $TaO_2$ may form instead of $Ta_2O_5$, but this does not change the principle described here.

Figure 2B:
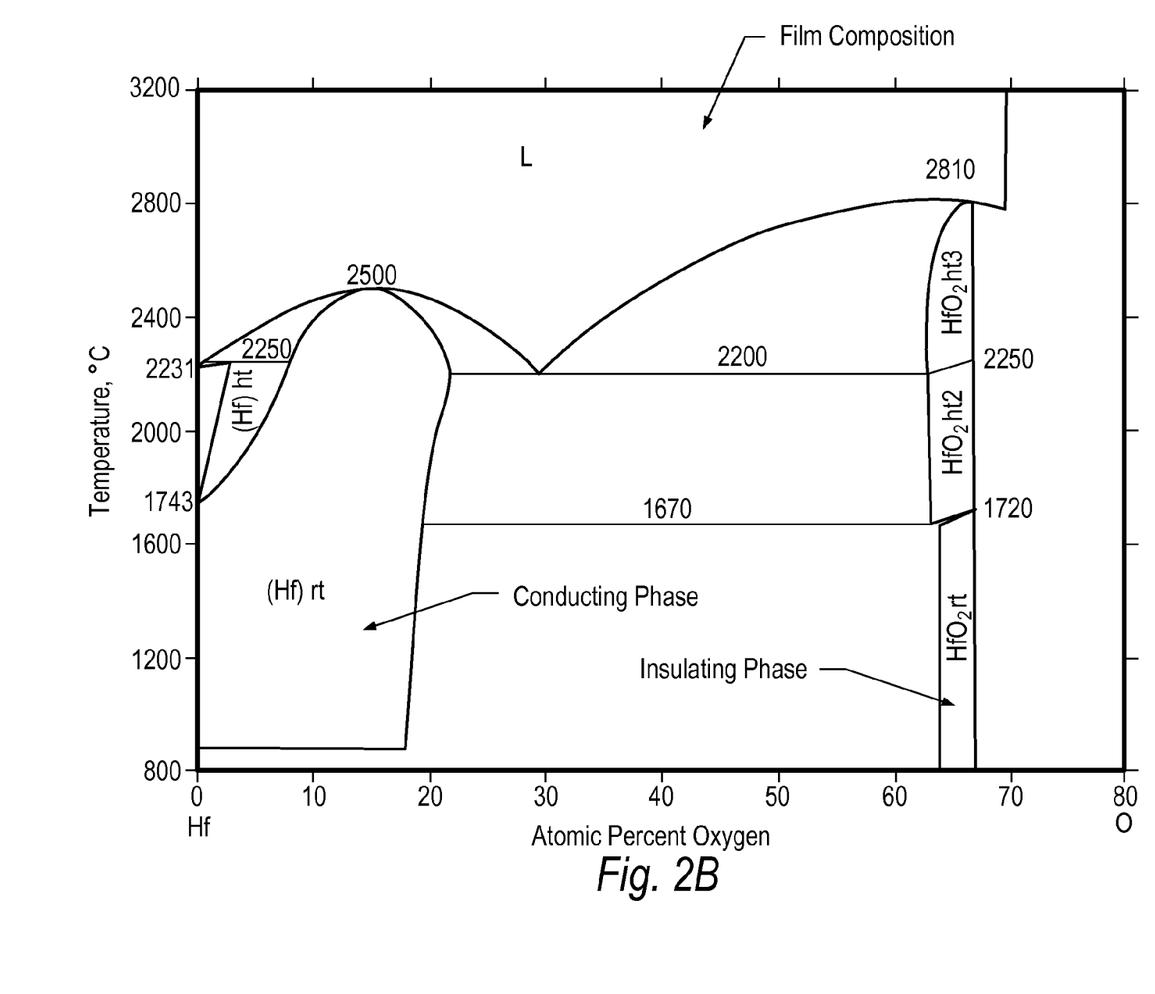

In the Hf—O system, shown in FIG. 2B, $HfO_2$ is the non-conducting first phase and the Hf—O solid solution is the conducting second phase. The $HfO_2$ phase is about 67 at % oxygen.

Figure 2C:
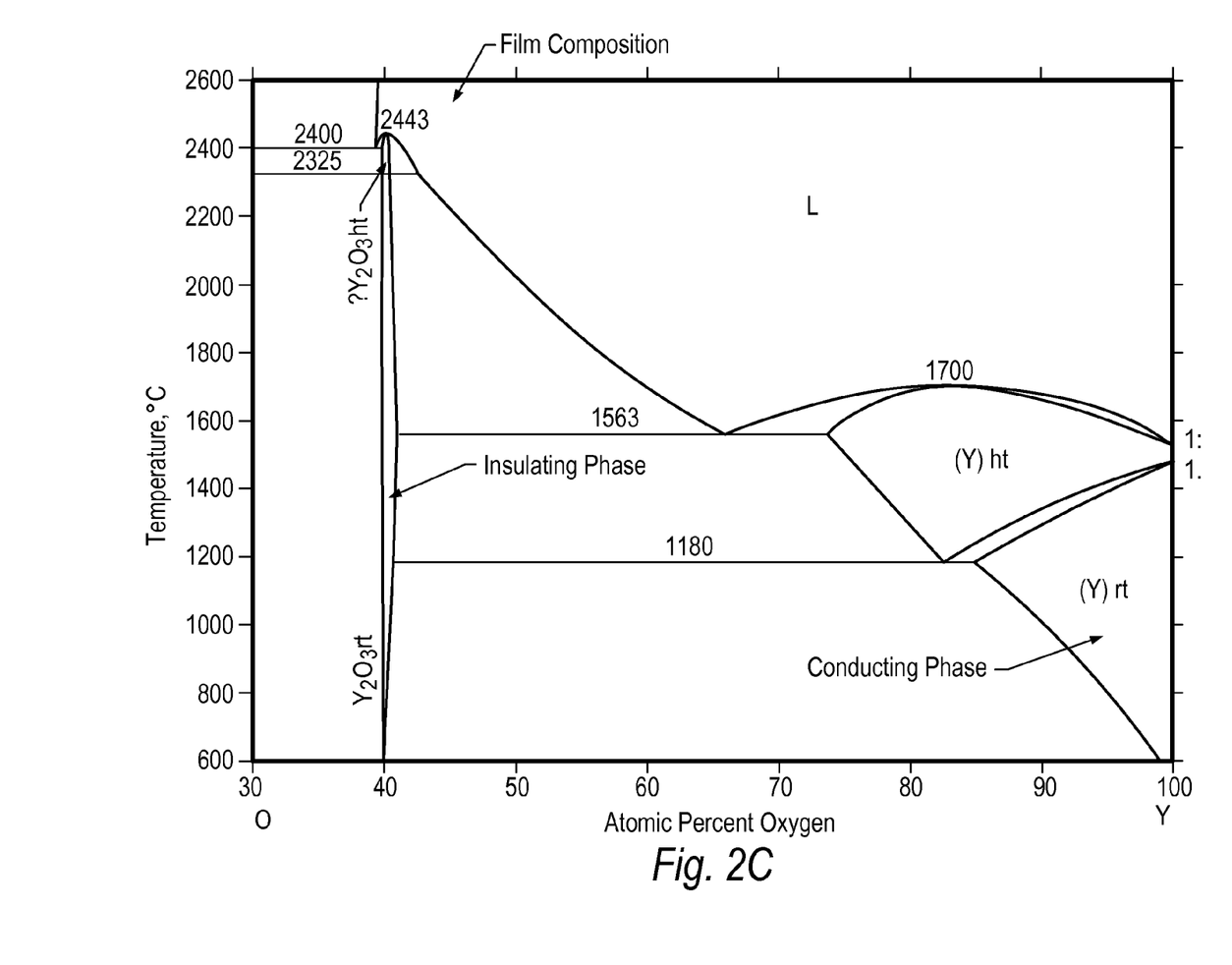

In the Y—O system, shown in FIG. 2C, $Y_2O_3$ is the non-conducting first phase and Y-O solid solution is the conducting second phase. The $Y_2O_3$ phase is about 60 at % oxygen.

Thus, a discontinuous, relatively conducting second phase 114 is dispersed in a continuous relatively non-conducting (resistive) first phase 112. The formation of the combined phases may be achieved using a sputtering process, wherein the composition of the sputtering source is close to the desired film composition. For example, in the case of the Ta—O system, a $TaO_x$ composition close to the $Ta_2O_5$ composition (71.4 at %) may be employed. By "close" is meant within about 20 at % of the non-conducting composition, or greater than about 51 at % oxygen and less than 71.4 at % oxygen for the Ta—O system. During sputtering, $O_2$ may be in the sputtering environment. If present, the resulting film, or switching layer 110, may have more oxygen content than the sputtering source. If $O_2$ is absent, the resulting film may have less oxygen content than the sputtering source.

Sputtering may be performed in an argon environment. Depending on the sputtering conditions, a two-phase system may or may not be formed. If the two-phase system is formed, then the film 110 comprises the discontinuous conducting second phase 114 dispersed in the continuous first phase 112. If the two-phase system is not formed, then the film that is formed may be amorphous. However, upon the first application of an electric field, localized heating takes place, and the two-phase system is formed, with the discontinuous second phase 114 dispersed in the continuous first phase 112. In either case, the first application of the electric field forms the conducting channels 120. The sputtering deposition conditions control the morphology of the film, and may require some experimentation. The typical variables are the substrate temperature, the gas environment, the deposition rate, etc. However, for persons skilled in this art, such experimentation is not considered undue, based on the disclosure herein.

As shown in FIG. 1, the conducting channel 120 is formed in the switching layer 110 at a junction between the first electrode 102 and the second electrode 104. While one conducting channel 120 is shown (and described herein), it will be appreciated that there are a number of such conducting channels that form during the heating process, some of which may extend from the first electrode 102 to the second electrode 104 and others of which may terminate at one or both ends within the matrix comprising the non-conducting first phase 112.

The conducting channel 120 is formed through a localized atomic modification in the switching layer 112 caused by the annealing or other thermal forming process. By way of particular example in which the switching material 112 comprises $\beta$-$Ta_2O_5$ and the conducting phase 114 comprises Ta—O solid solution, during the thermal forming process, regions of the conducting phase 114 coalesce to form at least one conducting channel 120.

In addition, one or more conducting channels 120 are configured to form in the areas containing the Ta—O solid solution and these conducting channel(s) 120 are responsible for the subsequent switching in the memristor 100. Without subscribing to any particular theory, it appears that one channel usually becomes the dominant path. During the switching operation, the oxygen or metal atoms are configured to move in an electric field conducted through the conducting channel(s) 120 to open or close a gap inside the conducting channel(s) 120, which may be read to determine whether the electrically actuated apparatus 100 is in an ON or OFF state.

The conducting channel(s) 120 are referred to herein as the active region of the memristor 100. In one regard, the conductivity of the conducting channel(s) 120 may be modulated by applying different biases across the first electrode 102 and the second electrode 104. Thus, the memristor 100 may be reconfigurable based upon the bias applied across the first electrode 102 and the second electrode 104. In other instances, however, the switching layer 110 may be formed to be singly configurable.

To determine appropriate oxide systems that may be employed in the practice of the invention, an inspection of a selected phase diagram is done. In particular, both a conducting region and an insulating region are desired, and a composition close to the insulating (non-conducting) region is selected. The composition has less oxygen than the insulating region, since compositions in the conducting region have a lower oxygen content. While the conducting composition may be anywhere in the conducting region, in some embodiments, the conducting composition is close to the composition of the non-conducting region, as defined above. For example, in the $Ta_2O_5$ system, where the nonconducting oxide is at 71.4 wt % oxygen, the conducting composition may be in the range of about 51 at % to less than 71.4 at % oxygen, as described above. In the $HfO_2$ system, where the non-conducting oxide is at about 67 at % oxygen, the conducting composition may be in the range of about 47 at % to less than 67 at % oxygen. In the $Y_2O_3$ system, where the non-conducting oxide is at about 60 at % oxygen, the conducting composition may be in the range of about 40 at % to less than 60 at % oxygen.

The same considerations apply for systems other than binary oxides, such as complex oxides, sulfides, and nitrides.

Figure 3:
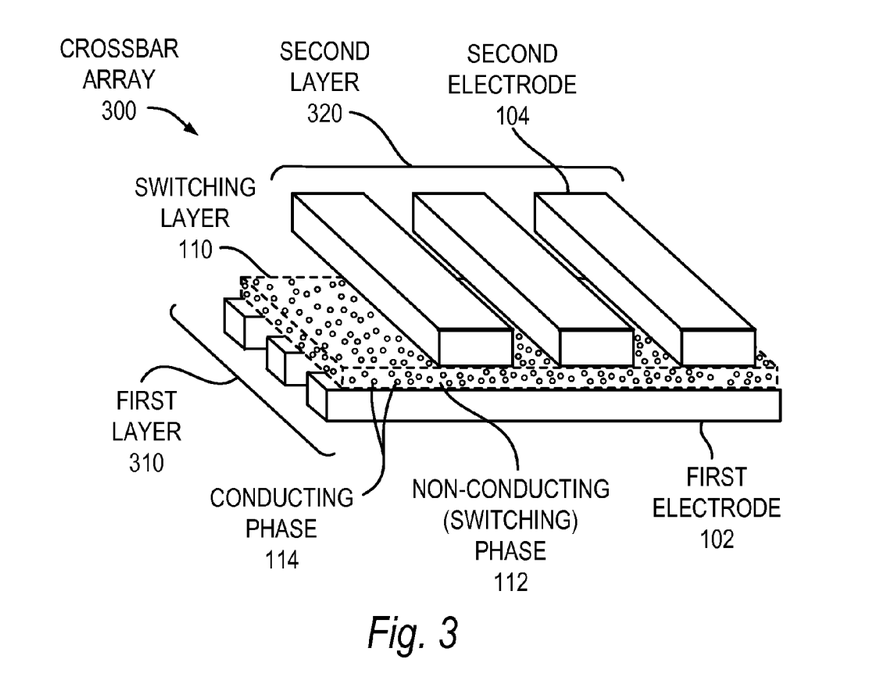
FIG. 3 illustrates a perspective view of a crossbar array employing a plurality of the memristors depicted in FIG. 1, according to an embodiment of the invention.

With reference now to FIG. 3, there is shown a perspective view of a crossbar array 300 employing a plurality of the memristors 100 shown in FIG. 1, according to an embodiment. It should be understood that the crossbar array 300 depicted in FIG. 3 may include additional components and that some of the components described herein may be removed and/or modified without departing from a scope of the crossbar array 300.

As shown in FIG. 3, a first layer 310 of approximately parallel first electrodes 102 is overlain by a second layer 320 of approximately parallel second electrodes 104. The second electrodes 104 of the second layer 320 may be roughly perpendicular, in orientation, to the first electrodes 102 of the first layer 310, although the orientation angle between the layers may vary, as described above. The two layers 310 and 320 form a lattice, or crossbar, with each second electrode 104 of the second layer 320 overlying all (or most) of the first electrodes 102 of the first layer 310 and coming into close contact with each first electrode 102 of the first layer 310 at respective junctions, which represent the closest contact between two of the first and second electrodes 102 and 104. The crossbar array 300 may be fabricated from micron-, submicron or nanoscale-electrodes 102, 104, depending on the application.

As also shown in FIG. 3, the switching layer 110 extends between the first layer 310 and the second layer 320. As discussed in greater detail herein below, respective conducting channels 120 (not shown) are formed in multiple ones of the memristors 100 concurrently during the thermal forming process.

Although the first electrode 102 and the second electrode 104 have been depicted as having rectangular cross-sections in FIGS. 1 and 2, it should be understood that the first electrode 102 and/or the second electrode 104 may have other cross-sectional shapes, such as circular, oval, hexagonal, triangular, trapezoidal, etc.

Figure 4:
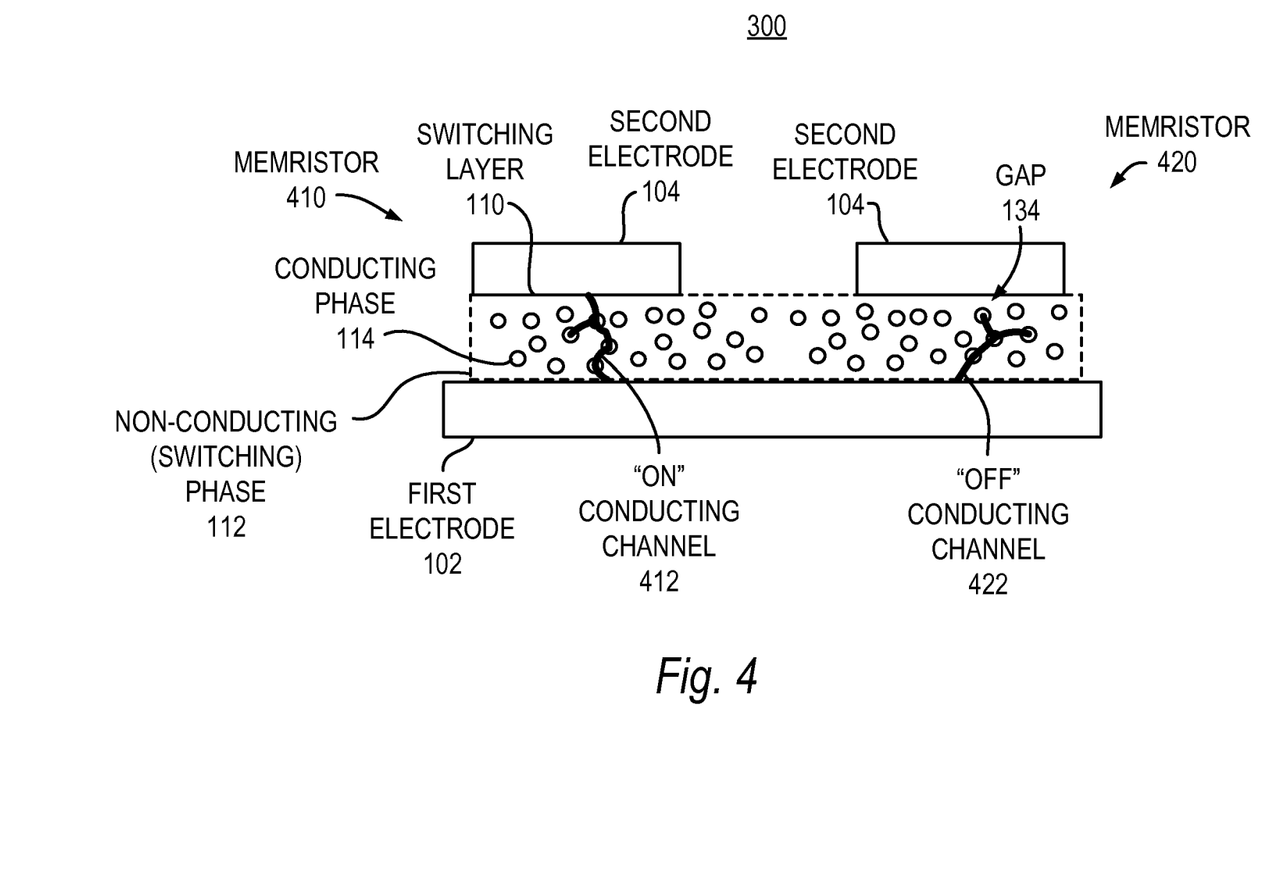
FIG. 4 illustrates a cross-sectional side view of a pair of memristors, according to an embodiment of the invention.

Turning now to FIG. 4, there is shown a cross-sectional side view 400 of a pair of memristors 410 and 420, according to an example. As shown therein, a first memristor 410 is depicted as having an "ON" conducting channel 412 formed in the junction between the first electrode 102 and the second electrode 104. The conducting channel 412 is construed as being "ON" because the conducting channel 412 extends from the first electrode 102 to the second electrode 104 and thus, there is a relatively low resistance to electrical energy supplied between the first electrode 102 and the second electrode 104 of the first memristor 410.

As also shown in FIG. 4, a second memristor 420 is depicted as having an "OFF" conducting channel 422 formed in the junction between the first electrode 102 and a second electrode 104 of the memristor 420. The conducting channel 422 is construed as being "OFF" because the conducting channel 422 does not extend from the first electrode 102 to the second electrode 104. Instead, a gap 134 exists in the conducting channel 422 and thus, there is a relatively higher resistance to electrical energy supplied between the first electrode 102 and the second electrode 104 of the second memristor 420.

Figure 5:
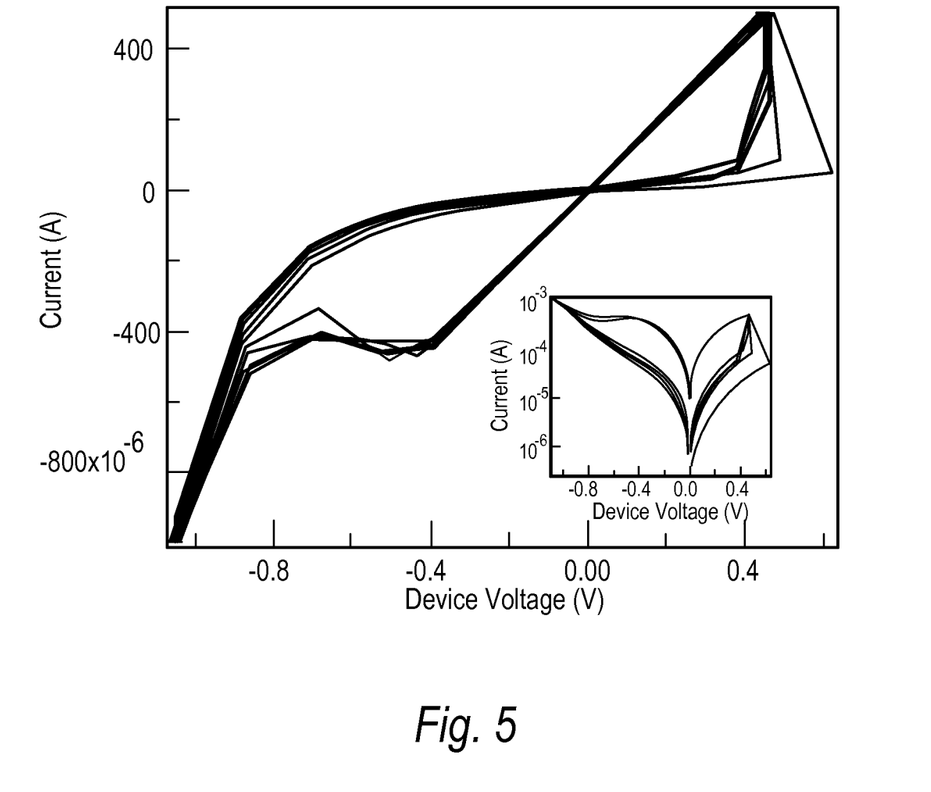
FIG. 5, on coordinates of current (A) and device voltage (V), depicts the switching I-V loops for a $TaO_x$-based memristor, according to an embodiment of the invention.

FIG. 5 is an I-V plot showing switching I-V loops for several switch cycles, specifically, five switch cycles, demonstrating repeatability. The insert shows the same information, but where current is depicted on a log scale. The data were obtained for a $TaO_x$ memristor. The device comprised $TaO_2$ (67 at % oxygen) 15 nm thick, sandwiched between a first Pt electrode 15 nm thick and a second Pt electrode 30 nm thick. The $TaO_2$ layer was deposited at room temperature, using argon sputtering from a $TaO_2$ target. The memristor comprised a first, nonconducting continuous phase of $\beta$-$Ta_2O_5$ (or mixed with the metastable phase $TaO_2$) in which a second, conducting discontinuous phase of Ta—O solid solution was dispersed.

Figure 6:
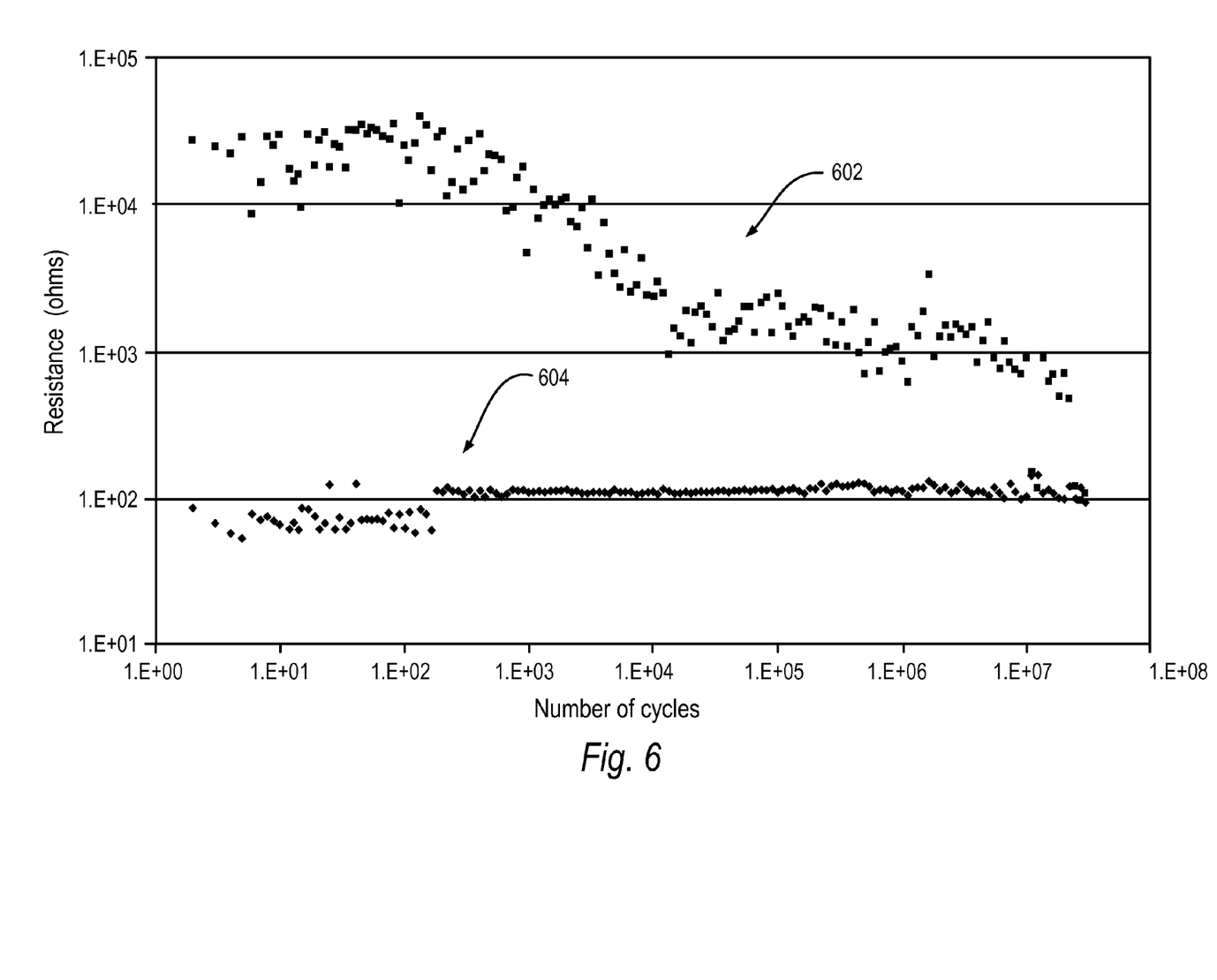
FIG. 6, on coordinates of resistance in ohms and number of cycles, is a plot showing endurance of a $TaO_x$-based memristor fabricated in accordance with an embodiment of the invention, depicting switching between high resistance states (device OFF) and low resistance states (device ON).

FIG. 6 is a plot showing endurance. A $TaO_x$ memristor, prepared as described above, was switched between ON and OFF states. The upper data points, generally denoted as 602, depict the resistance in an OFF state (relatively high resistance), while the lower data points, generally denoted as 604, depict the resistance in an ON state (relatively low resistance). Although there appears to be a downward trend of the resistance of the OFF state, it is seen that the memristor is still operating at 10 million cycles with about 10 times the ON/OFF conductance ratio.

Figure 7:
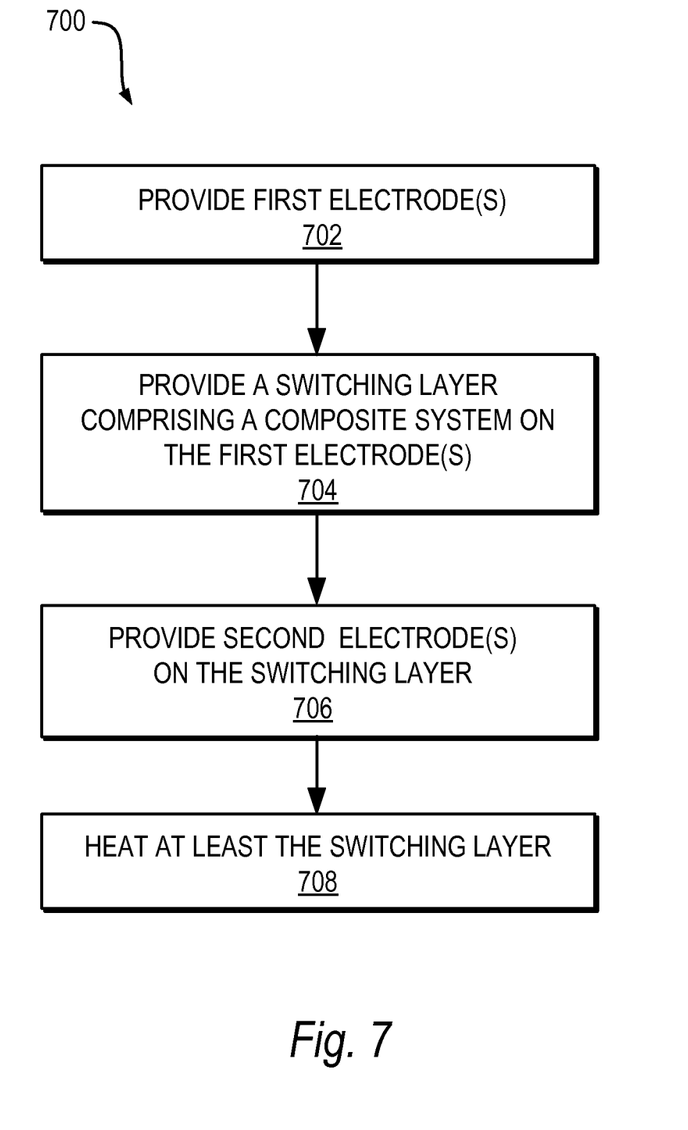
FIG. 7 illustrates a flow diagram of a method for fabricating a memristor, according to an embodiment of the invention.

Turning now to FIG. 7, there is shown a flow diagram of a method 700 for fabricating a memristor 100, according to an embodiment. It should be understood that the method 700 depicted in FIG. 7 may include additional steps and that some of the steps described herein may be removed and/or modified without departing from a scope of the method 700.

At step 702, one or more first electrodes 102 are provided. The first electrode(s) 102 may be provided through any suitable formation process, such as, chemical vapor deposition, sputtering, etching, lithography, etc. In addition, when the method 700 is implemented to form a cross-bar array 200, a plurality of first electrodes 102 may be provided as a first layer 210 of first electrodes 102, for instance, as depicted in FIG. 3.

At step 704, a switching layer 110, formed of the composite comprising the continuous matrix of the switching material 112 and the non-continuous conducting material 114, is provided upon the first electrode(s) 102. According to an example, the non-conducting phase 112 and the conducting phase 114 are co-deposited, such as through sputtering, pulse laser deposition, atomic layer deposition, etc., to form the switching layer 110. According to another example, the conducting phase 114 is interspersed into the non-conducting phase 112 prior to deposition of the matrix of materials on the first electrode(s) 102. According to a further example, the non-conducting phase 112 is grown on the electrode(s) 102 and the conducting phase 114 is deposited on the conducting phase 112 during the growth process. In this example, the non-conducting phase 112 may be grown through use of, for instance, metal-catalyzed growth from vapor, liquid, or solid-phase precursors, growth from a chemical solution, spin coating or rapid deposition of material vaporized from a solid source, such as by sputtering or ALD (Atomic Layer Deposition).

In any event, the amount of conducting phase 114 dispersed in the nonconducting phase 112 may be varied to control the formation of the conducting channel(s) 120.

Following step 704, a top surface of the switching layer 110 may be planarized, for instance, by chemical-mechanical polishing, to create a relatively smooth surface.

At step 706, one or more second electrodes 104 are formed on the switching layer 110. The one or more second electrodes 104 may be provided through a formation process, such as E-beam evaporation, chemical vapor deposition, sputtering, atomic layer deposition, etching, (imprint) lithography, etc.

At step 708, a heating operation or other thermal forming operation, such as an annealing operation, is performed on at least the switching layer 110, and may include the first electors 102 and the second electrodes 104 to cause one or more conducting channels 120 to form in one or more junctions of the first electrode(s) 102 and second electrode(s) 104. As discussed above, the application of heat to the switching layer 110 causes the conducting material 114 to coalesce into the conducting channels 120 in the switching layer 110.

One or more parameters of the heating operation may be varied to control formation of the conducting channels 120 in the switching layer 110. The parameters include, for instance, temperature, duration, rate of annealing, environmental conditions, etc. According to an embodiment, the parameters are controlled to cause the conducting channels 120 to have relatively small diameters, for instance, on the order of a few nanometers. By way of particular example, the conducting channels 120 may be controlled to have diameters within the range of about 0.5 to about 100 nm.

Although step 708 has been described as being performed after the second electrode(s) 104 have been provided, it should be understood that the annealing operation may be performed prior the second electrode(s) 104 being provided.

Through implementation of the method 700, conducting channels 120 may be formed in the switching layer 110 between one or more memristors 100 without requiring that an electroforming operation be implemented to form the conducting channels 120. In instances where the method 700 is employed to form the conducting channels 120 in multiple memristors 100, the method 700 may also be implemented to concurrently form the conducting channels 120 in the memristors 100.

What has been described and illustrated herein is an embodiment along with some of its variations. The terms, descriptions and figures used herein are set forth by way of illustration only and are not meant as limitations. Those skilled in the art will recognize that many variations are possible within the spirit and scope of the subject matter, which is intended to be defined by the following claims—and their equivalents—in which all terms are meant in their broadest reasonable sense unless otherwise indicated.

What is claimed is:

1. A memristor with a switching layer including a composite of multiple phases, the memristor comprising:
    a first electrode;
    a second electrode spaced from the first electrode; and
    a switching layer positioned between the first electrode and the second electrode, the switching layer comprising the multi-phase composite system that comprises a first majority phase comprising a relatively insulating matrix of a switching material and a second minority phase dispersed in the first majority phase and comprising a relatively conducting material, selected from the group consisting of oxides, nitrides, and sulfides, that forms at least one conducting channel in the switching layer.

2. The memristor of claim 1, wherein wherein the at least one conducting channel is to be formed during performance of a thermal forming operation.

3. The memristor of claim 1, wherein the switching material comprises a material selected from the group consisting of transition metal oxides and metal oxides and wherein the relatively conducting material is selected from the group consisting of transition metals, metals, and relatively conducting transition metal oxides having a conductivity at least 10 times compared to that of the switching material.

4. The memristor of claim 3 wherein the transition metal oxides are selected from the group consisting of tantalum oxide, hafnium oxide, yttrium oxide, zirconium oxide, and stoichiometric titanium dioxide, wherein the metal oxides are selected from the group consisting of aluminum oxide, calcium oxide, and magnesium oxide, wherein the transition metals are selected from the group consisting of tantalum, hafnium, yttrium, and zirconium, wherein the metals are selected from the group consisting of aluminum, calcium, and magnesium, and wherein the relatively conducting transition metal oxide is a solid solution of the metal and oxygen.

5. The memristor of claim 1, wherein formation of the at least one conducting channel occurs in the switching layer without performance of an electroforming operation.

6. The memristor of claim 1 including a composite of two phases.

7. A method for fabricating a memristor, the method comprising:
    providing a first electrode;
    providing on the first electrode a switching layer comprising a multi-phase composite system that comprises a first majority phase comprising a relatively insulating matrix of a switching material and a second minority phase dispersed in the first majority phase and comprising a relatively conducting material, selected from the group consisting of oxides, nitrides, and sulfides, for forming at least one conducting channel in the switching layer during a fabrication process of the memristor; and, in either order,
    providing a second electrode on the switching layer; and
    heating at least the switching layer to form the at least one conducting channel in the switching layer.

8. The method of claim 7, wherein heating is performed by electrical resistance heating.

9. The method of claim 8 wherein at least the switching layer is heated to a temperature in a localized region inside the device that is several hundred degrees Celsius up to the eutectic temperature of the material system, which is significantly lower than that found in the bulk material phase diagrams due to nanoscale effects.

10. The method of claim 9, wherein heating further comprises controlling at least one parameter during the heating to variably control formation of the one or more conducting channels in the switching layer.

11. The method of claim 7 wherein the memristor comprises two phases.

12. A crossbar array composed of a plurality of memristors, the crossbar comprising an array of a first set of approximately parallel first electrodes crossing a second set of approximately parallel second electrodes, a memristor positioned at every intersection that a first electrode crosses a second electrode, the memristor comprising a switching layer positioned between the first electrode and the second electrode, the switching layer comprising the multi-phase composite system that comprises a first majority phase comprising a relatively insulating matrix of a switching material and a second minority phase dispersed in the first majority phase and comprising a relatively conducting material, selected from the group consisting of oxides, nitrides, and sulfides, that forms at least one conducting channel in the switching layer.

13. The crossbar array of claim 12, wherein the fabrication process of the memristor comprises performance of a thermal forming operation, and wherein the at least one conducting channel is configured to be formed during performance of the thermal forming operation.

14. The crossbar array of claim 12, wherein the switching material comprises a material selected from the group consisting of transition metal oxides and metal oxides and wherein the relatively conducting material is selected from the group consisting of transition metals, metals, and relatively conducting transition metal oxides having a conductivity at least 10 times compared to that of the switching material.

15. The crossbar array of claim 14 wherein the transition metal oxides are selected from the group consisting of tantalum oxide, hafnium oxide, yttrium oxide, zirconium oxide, and stoichiometric titanium dioxide, wherein the metal oxides are selected from the group consisting of aluminum oxide, calcium oxide, and magnesium oxide, wherein the transition metals are selected from the group consisting of tantalum, hafnium, yttrium, and zirconium, wherein the metals are selected from the group consisting of aluminum, calcium, and magnesium, and wherein the relatively conducting transition metal oxide is a solid solution of the metal and oxygen.

16. The crossbar array of claim 12, wherein formation of the at least one conducting channel occurs in the switching layer without performance of an electroforming operation.

17. The crossbar array of claim 12, wherein each memristor includes a composite of two phases.

\* \* \* \* \*

UNITED STATES PATENT AND TRADEMARK OFFICE
CERTIFICATE OF CORRECTION

PATENT NO. : 8,415,652 B2
APPLICATION NO. : 12/819763
DATED : April 9, 2013
INVENTOR(S) : Jianhua Yang et al.

It is certified that error appears in the above-identified patent and that said Letters Patent is hereby corrected as shown below:

In the Claims

In column 10, line 18, in Claim 2, after "claim 1," delete "wherein".

Signed and Sealed this
First Day of October, 2013

Teresa Stanek Rea
*Deputy Director of the United States Patent and Trademark Office*